(12) United States Patent
Umeda et al.

(10) Patent No.: US 6,252,296 B1
(45) Date of Patent: Jun. 26, 2001

(54) SEMICONDUCTOR DEVICE WITH SILICON OXYNITRIDE GATE INSULATING FILM

(75) Inventors: Hiroshi Umeda; Hiroaki Tamura, both of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/270,054

(22) Filed: Mar. 16, 1999

(30) Foreign Application Priority Data

Sep. 18, 1998 (JP) .................................................. 10-264444

(51) Int. Cl.$^7$ .................................................. H01L 23/58
(52) U.S. Cl. .................................... 257/639; 257/649
(58) Field of Search ........................................ 257/639, 649

(56) References Cited

U.S. PATENT DOCUMENTS 5,726,087 * 3/1998 Tseng et al. ........................ 438/261

FOREIGN PATENT DOCUMENTS 6-151829    5/1994 (JP) .
9-306907   11/1997 (JP) .

OTHER PUBLICATIONS

"Controlled Nitridation of SiO2 for the Formation of Gate Insulators in FET Devices", IBM Technicla Disclosure Bulletin, vol. 28, Issue No. 6, pp. 2665–2666, Nov. 1985.*
"Role of Interfacial Nitrogen in Improving Thin Silicon Oxides Grown in N2O", E.C. Carr et al., Applied Physics Letter 63(1), Jul. 5, 1993, pp. 54–56.

* cited by examiner

*Primary Examiner*—Sara Crane
*Assistant Examiner*—Thien F. Tran
(74) *Attorney, Agent, or Firm*—McDermott, Will & Emery

(57) ABSTRACT

A semiconductor device is formed with a silicon oxynitride gate insulating film to exhibit high TDDB characteristics. The silicon oxynitride film is formed on a silicon substrate and does not include an $SiNO_2$ chemical bond unit at any portion in the film thickness direction.

4 Claims, 8 Drawing Sheets

SEMICONDUCTOR DEVICE WITH SILICON OXYNITRIDE GATE INSULATING FILM

BACKGROUND OF THE INVENTION

1. Field of the Invention

The present invention generally relates to a method of manufacturing a semiconductor device including the step of forming a silicon oxynitride film on a silicon substrate, and more particularly to a method of localizing nitrogen at an interface between the silicon substrate and the silicon oxynitride film. The present invention also relates to a semiconductor device obtained by such methods.

2. Description of the Background Art

The method of forming a silicon oxynitride film as a gate insulating film on a silicon substrate is conventionally known. The silicon oxynitride film as a gate insulating film is used because the reliability of an insulating film and therefore a device increases compared with a silicon oxide film.

The method of forming a silicon oxynitride film is described in Appl. Phys. Lett. 63 (1993), p. 54, for example. Here, a silicon oxynitride film is formed by using $N_2O$ gas and an RTA device (Rapid Thermal Anneal device). Meanwhile, it is known that an oxynitride film formed by an older prior art diffusion furnace has nitrogen diffused to the entire film.

However, any of the conventional methods was not designed for intentionally controlling the depth direction profile of nitrogen in an oxynitride film. Therefore, a method in which TDDB (Time Dependent Directric Breakdown) characteristics are sufficiently satisfied has not been obtained. That is, when a silicon oxynitride film obtained by a conventional method is used as a gate insulating film, the silicon substrate and the gate electrode are electrically connected.

SUMMARY OF THE INVENTION

The present invention is intended to solve the above mentioned problems and its object is to provide a method of manufacturing a semiconductor device which has a silicon oxynitride film having superior TDDB characteristics.

Another object of the present invention is to provide a method of forming a silicon oxynitride film having TDDB characteristics superior than a silicon oxynitride film having nitrogen distributed to the entire film.

Still another object of the present invention is to provide a semiconductor device obtained by such methods.

The invention according to claim 1 relates to a method of manufacturing a semiconductor device having a silicon oxynitride film. First, a silicon substrate is prepared. Gas including non-pyrolized $N_2O$ is brought into contact with a surface of the silicon substrate while the silicon substrate is heated, and thereby a silicon oxynitride film is formed on the surface of the silicon substrate.

According to the invention, the gas including non-pyrolized $N_2O$ is brought into contact with the surface of the heated silicon substrate. It was found out that nitrogen in the silicon oxynitride film formed by this method localizes at an interface between the silicon substrate and the silicon oxynitride film. It was also found out that an $Si-NO_2$ chemical bond unit does not exist at the interface and a portion other than the interface (hereinafter, referred to as a bulk portion). It was also made clear that the silicon oxynitride film having nitrogen localized at the interface has TDDB characteristics improved compared with a silicon oxynitride film having nitrogen uniformly distributed in the film.

In a method of manufacturing a semiconductor device according to claim 2, the above described gas including $N_2O$ is introduced from the side of the silicon substrate to the surface of the silicon substrate at a flow speed of 0.5 m/sec or more.

Since the flow speed of $N_2O$ gas is made higher than 0.5 m/sec according to the method, pyrolisis of $N_2O$ is not caused. As a result, a silicon oxynitride film having nitrogen localized only at an $SiO_2/Si$ interface can be formed.

In a method of manufacturing a semiconductor device according to claim 3, the above described $N_2O$ gas is brought into contact with the surface of the silicon substrate while the silicon substrate is rotated.

Since it is performed while the silicon substrate is rotated, the gas flow is disturbed. Thus, $N_2O$ gas that is not heated, that is, not pyrolyzed always reacts with the silicon substrate. As a result, a silicon oxynitride film having nitrogen localized only at an $SiO_2/Si$ interface can be formed.

The invention according to claim 4 relates to a method of manufacturing a semiconductor device having a silicon oxynitride film. First, a silicon substrate is prepared. Gas including non-pyrolyzed $N_2O$ is blown like a shower to a surface of the silicon substrate from above while the silicon substrate is heated, and thereby a silicon oxynitride film is formed on the surface of the silicon substrate.

Since the gas including non-pyrolyzed $N_2O$ is blown like a shower to the surface of the silicon substrate according to the invention, $N_2O$ can react with the silicon substrate without pyrolyzing $N_2O$. As a result, an oxynitride film having nitrogen localized only at an $SiO_2/Si$ interface can be formed.

The invention according to claim 5 relates to a method of manufacturing a semiconductor device having a silicon oxynitride film. An oxide is formed on a silicon substrate. A compound of nitrogen and oxygen is ion-implanted to an interface between the silicon substrate surface and the oxide film.

According to the present invention, a silicon oxynitride film having nitrogen localized only at an $SiO_2/Si$ interface can also be formed. Accordingly, a silicon oxynitride film having superior TDDB characteristics can be obtained.

A semiconductor device according to claim 6 includes a silicon substrate. On the silicon substrate, a silicon oxynitride film is provided that does not include the chemical bond unit shown by the structural formula below at any portion in the film thickness direction.

Since the silicon oxynitride film as a gate insulating film does not include an $Si-NO_2$ chemical bond unit at any portion in the film thickness direction according to the present invention, a silicon oxynitride film having superior TDDB characteristics can be obtained.

In a semiconductor device according to claim 7, the silicon oxynitride film is formed by bringing gas including non-pyrolyzed $N_2O$ into contact with a surface of the silicon substrate while the silicon substrate is heated.

When a silicon oxynitride film is formed by this method, a silicon oxynitride film that does not include an $Si-NO_2$ chemical bond unit at any portion in the film thickness direction can be obtained.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The embodiments of the present invention will be described in the following with reference to the drawings.

First Embodiment

Figure 1:
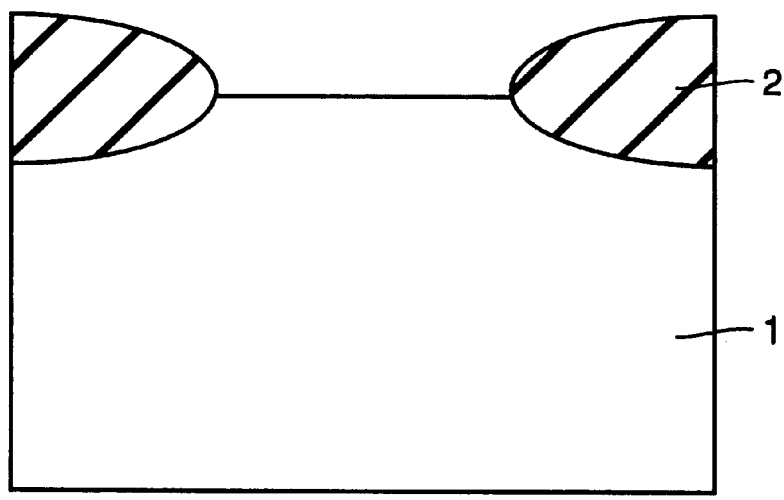
FIGS. 1 to 3 are cross sectional views of a semiconductor device in first to third steps of a method of manufacturing a semiconductor device according to a first embodiment.

Referring to FIG. 1, an element isolation insulating film 2 is formed on a surface of a silicon substrate 1.

Figure 2:
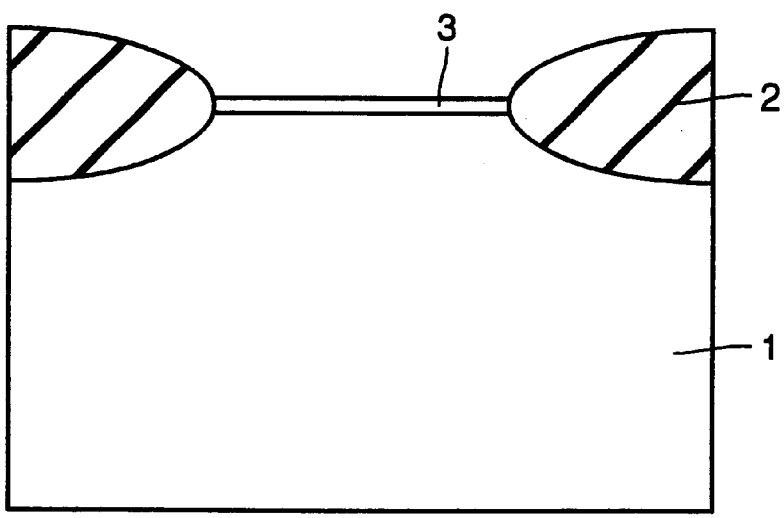

Referring to FIG. 2, only silicon substrate 1 is heated without heating $N_2O$ gas, and $N_2O$ and silicon substrate 1 are caused to react with each other to form a silicon oxynitride film 3.

When $N_2O$ gas is pyrolyzed, three reactions (1), (2) and (3) shown by the following formulas are caused. Since the reaction shown by formula (2) is rapid, the pyrolisis reaction of $N_2O$ gas can be represented by formula (4).

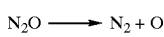

(1)

$$N_2O \longrightarrow N_2 + O$$

(2)

$$O + O \longrightarrow O_2$$

-continued

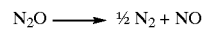

(3)

$$N_2O \longrightarrow \tfrac{1}{2} N_2 + NO$$

(4)

$$N_2O \longrightarrow N_2 + O_2 + NO$$

Figure 4A:
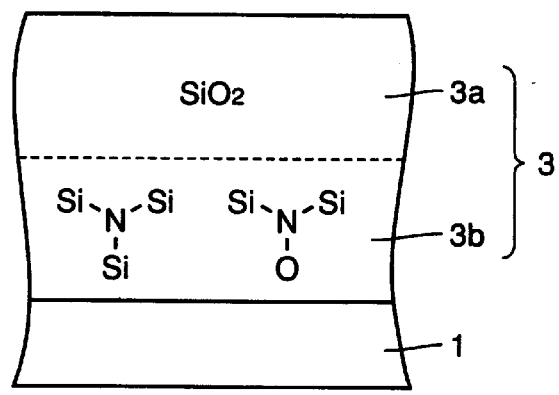
FIGS. 4A–4C show a cross sectional structure 4A of a silicon oxynitride film obtained by the method of the first embodiment, a cross sectional structure 4B of a silicon oxynitride film formed by a diffusion furnace, and a cross sectional structure 4C of a conventional silicon oxide film.

Since $N_2O$ and the silicon substrate are caused to react with each other without decomposing $N_2O$ gas in the first embodiment, the reaction shown by formula (2) is suppressed and active oxygen produced by formula (1) exists. Referring to FIG. 4A, silicon oxynitride film 3 is thus obtained that has nitrogen localized at an interface portion 3b between $SiO_2$ 3a and silicon substrate 1.

Figure 4B:
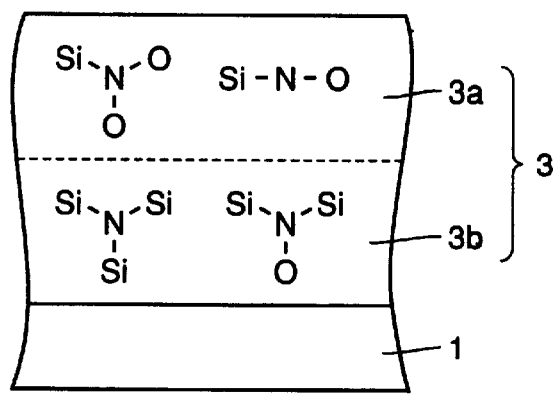

Meanwhile, the silicon oxynitride film produced by pyrolyzing $N_2O$ can be obtained as a silicon oxynitride film that has nitrogen atoms introduced to bulk portion as well 3a as well, as shown in FIG. 4B. This would be because, when $N_2O$ is pyrolyzed, the reaction shown by formula (2) is caused rapidly, causing active oxygen produced by formula (1) to disappear, the capability of removing nitrogen in bulk layer 3a is thus eliminated, and nitrogen atoms remain at bulk portion 3a.

Figure 4C:
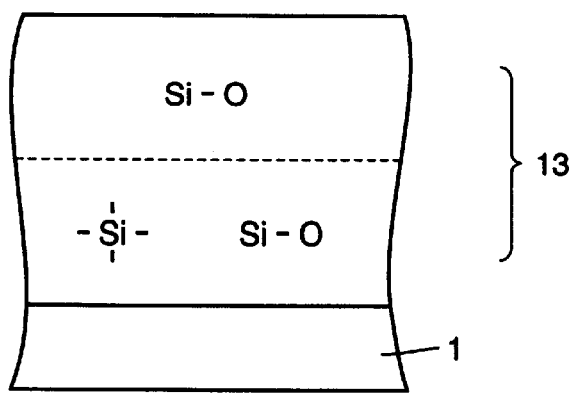

As a comparative example, FIG. 4C shows a cross sectional view of a semiconductor device when its gate insulating film is a silicon oxide film. When the gate insulating film is a silicon oxide film 13, a silicon dangling bond exists at an interface between silicon substrate 1 and silicon oxide film 13, and therefore the TDDB characteristics are very poor. The present invention is indented to solve this problem.

Figure 5:
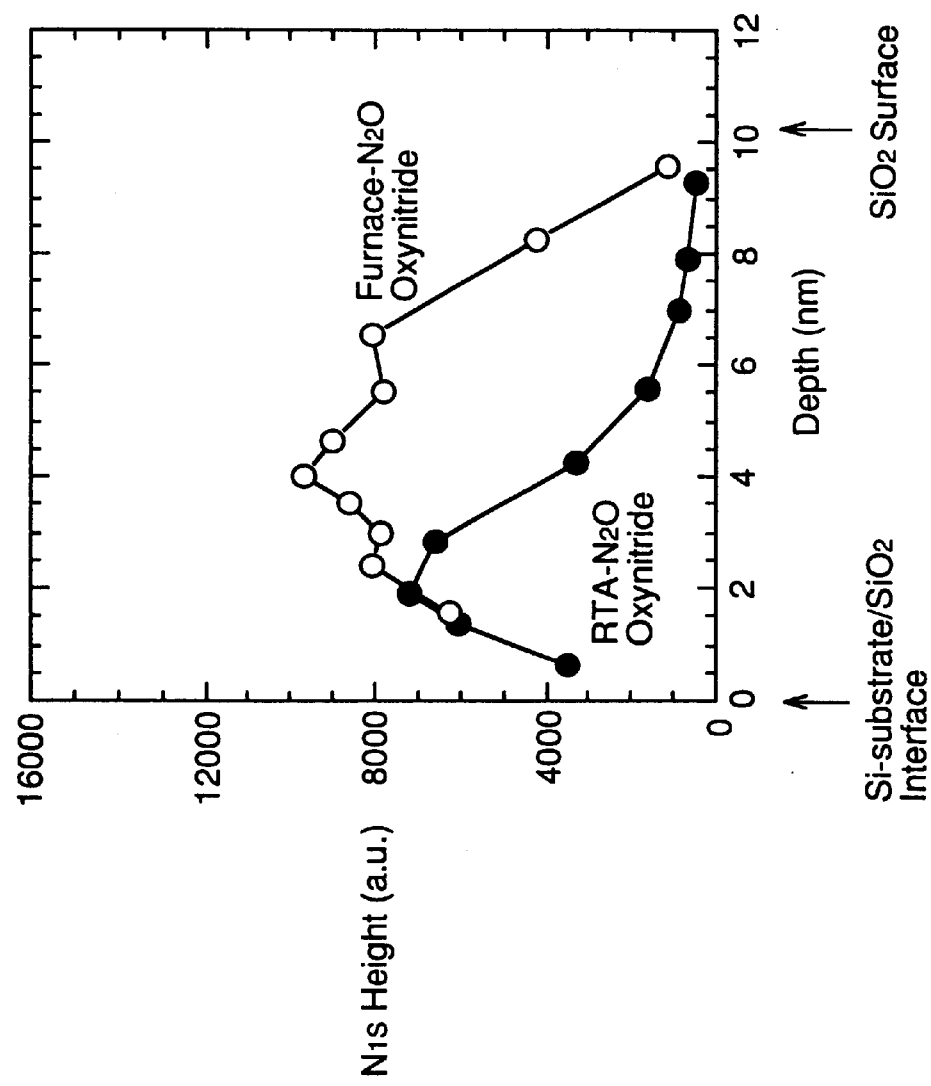
FIG. 5 shows, by comparison, the depth direction profiles of nitrogen in the silicon oxynitride film formed by the method according to the first embodiment and in the silicon oxynitride film formed by the diffusion furnace.

FIG. 5 shows the depth direction profiles of nitrogen in the obtained silicon oxynitride films. The abscissas denote the depth while the ordinates denote the height (arbitrary unit) of $N_{1S}$ which is measured by XPS (X ray photo electronic Spectroscopy). The depth (nm) of the abscissas denote the distance between the surface of a silicon substrate to the surface of an obtained silicon oxynitride film. In the graph, black circles denote the profile of a silicon oxynitride film obtained by the method shown in the first embodiment, and white circles denote the profile of a silicon oxynitride film formed by a conventional diffusion furnace. The black and white circles denote the same in FIGS. 6 and 7 described below, as well.

It can be seen that the silicon oxynitride film obtained by the method of the first embodiment has nitrogen localized at an interface portion between the silicon substrate and the silicon oxynitride film.

Figure 6:
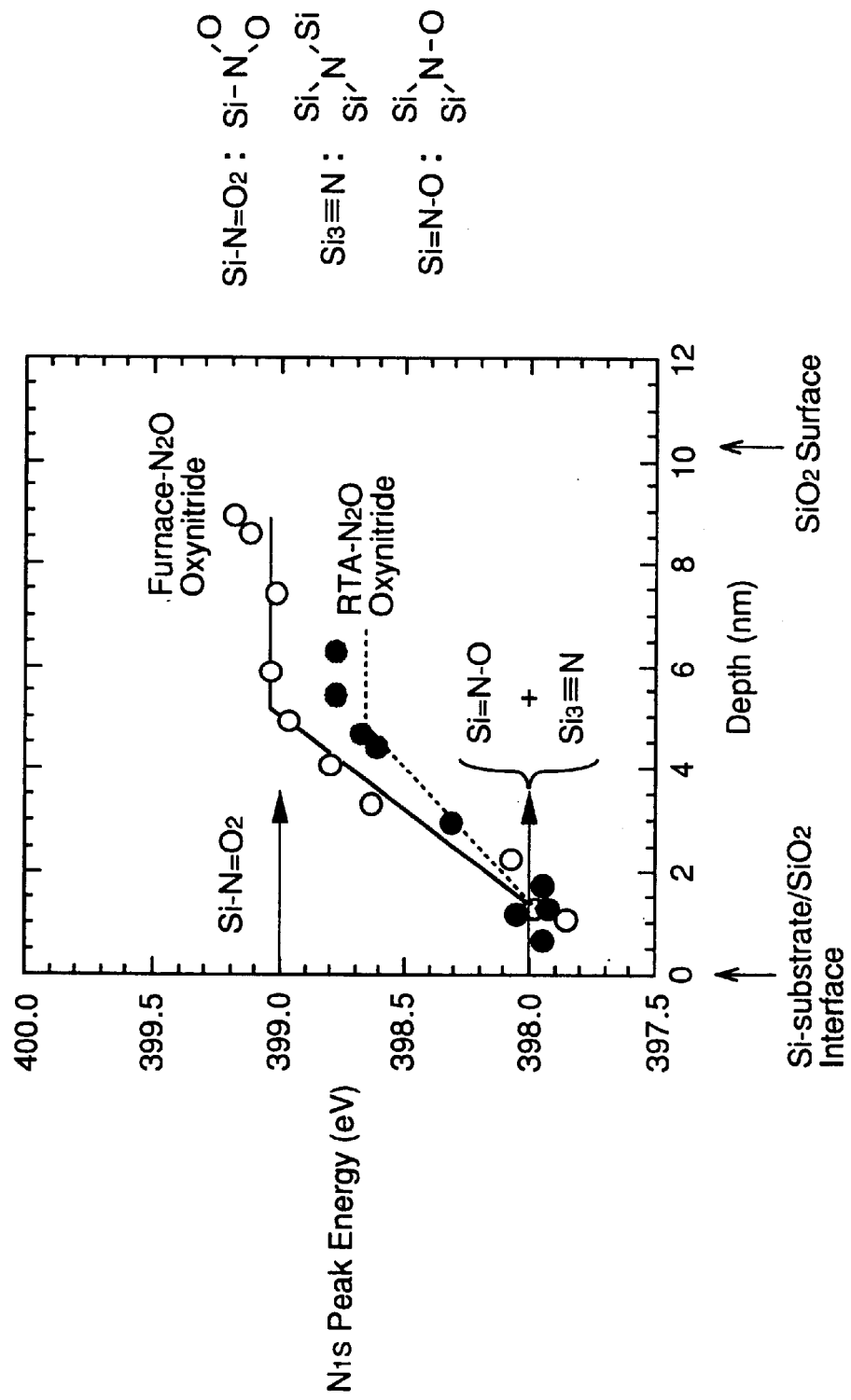
FIG. 6 shows, by comparison, the relations between $N_{1S}$ peak energy and depth in the silicon oxynitride film obtained by the method according to the first embodiment and in the silicon oxynitride film obtained by the diffusion furnace.

Similarly in FIG. 6, the abscissas denote the depth of a silicon oxynitride film and the ordinates denote N1S peak energy. The peak of an Si—$NO_2$ chemical bond unit is in the vicinity of 399.0 eV. The black circles denote data on a silicon oxynitride film obtained by the method of the first embodiment, and the white circles denote data on a silicon oxynitride film obtained by a diffusion furnace. It can be seen from the data that the silicon oxynitride film obtained by the diffusion furnace has an Si—$NO_2$ chemical bond unit at its surface while the silicon oxynitride film obtained by the method according to the first embodiment does not have an Si—$NO_2$ chemical bond unit at its surface.

Figure 3:
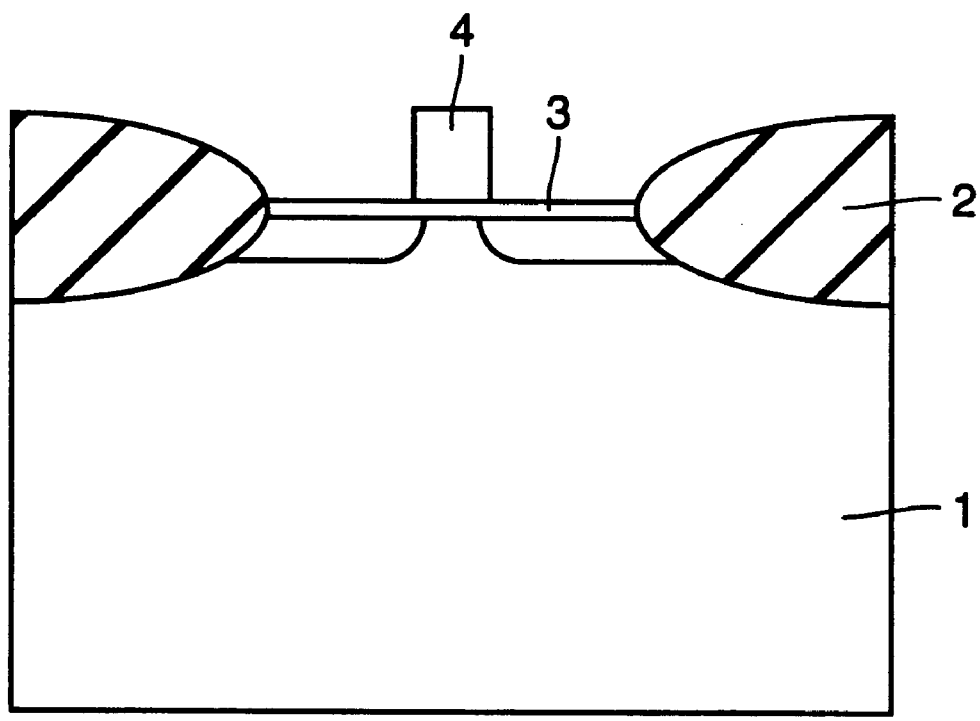

Referring to FIG. 3, a gate electrode 4 is formed on substrate 1 with silicon oxynitride film 3 therebetween.

Figure 7:
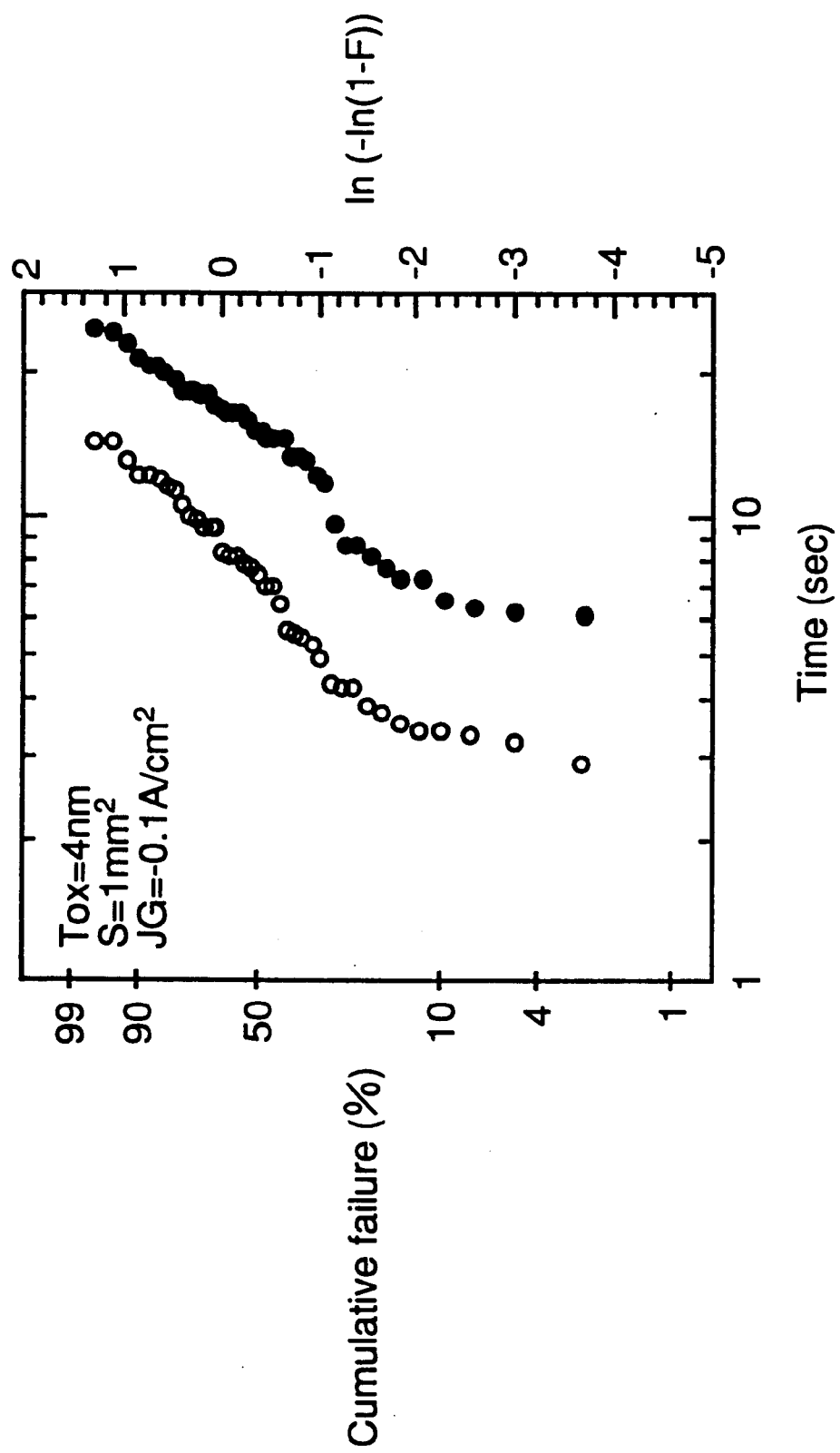
FIG. 7 shows, by comparison, the TDDB characteristics of the silicon oxynitride film obtained by the method according to the first embodiment and of the silicon oxynitride film obtained by the diffusion furnace.

The results of measuring the TDDB characteristics of obtained transistors are shown in FIG. 7. In FIG. 7, the white circles are data on a transistor produced by the method of the first embodiment, and the black circles are data on a transistor produced by using the silicon oxynitride film formed by the diffusion furnace. It can be seen that the silicon oxynitride film obtained by the method of the first embodiment has more improved TDDB characteristics.

Second Embodiment

Figure 8:
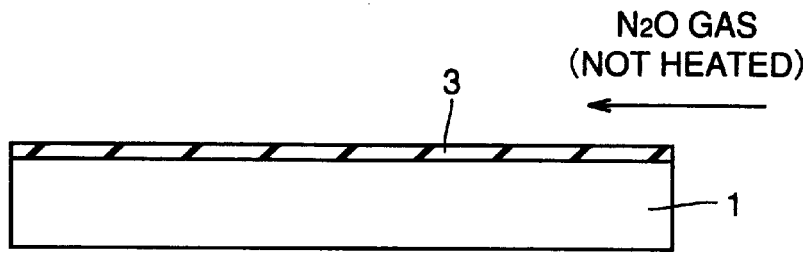
FIG. 8 is a cross sectional view of a semiconductor device in a method of manufacturing a silicon oxynitride film according to a second embodiment.

FIG. 8 is a cross sectional view of a semiconductor device for describing a method of forming a silicon oxynitride film according to a second embodiment.

The method according to this embodiment uses an RTA device. When the RTA device is used, $N_2O$ and silicon substrate 1 can be caused to react with each other without heating, that is, pyrolyzing $N_2O$. In this embodiment, $N_2O$ gas is supplied to the surface of silicon substrate 1 from the side of silicon substrate 1 as shown in the drawing. The flow speed of $N_2O$ gas is made higher than 0.5 m/sec so as not to heat, that is, pyrolyze $N_2O$ gas by silicon substrate 1. By adapting such a method, silicon oxynitride film 3 having nitrogen localized only at an $SiO_2$/Si interface can be formed.

Third Embodiment

Figure 9:
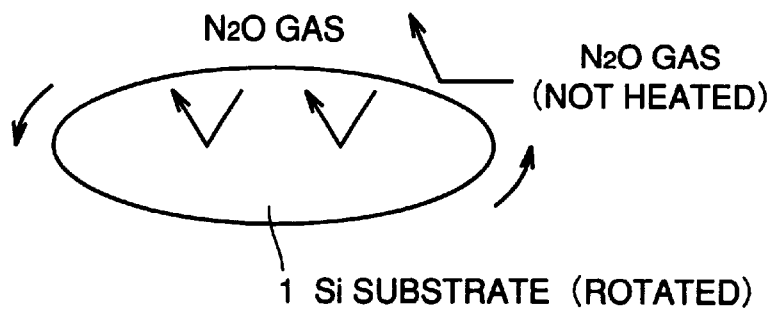
FIG. 9 shows a method of manufacturing a silicon oxynitride film according to a third embodiment.

FIG. 9 is a perspective view for describing a method of forming a silicon oxynitride film according to a third embodiment. In this embodiment, the RTA device is also used to cause $N_2O$ and silicon substrate 1 to react with each other without heating, that is, pyrolyzing $N_2O$. In this embodiment, silicon substrate 1 is rotated to disturb the gas flow, and $N_2O$ gas that is not heated, that is, not pyrolyzed always reacts with silicon substrate 1. According to this method, a silicon oxynitride film having nitrogen localized only at an $SiO_2$/Si interface is obtained.

Fourth Embodiment

Figure 10:
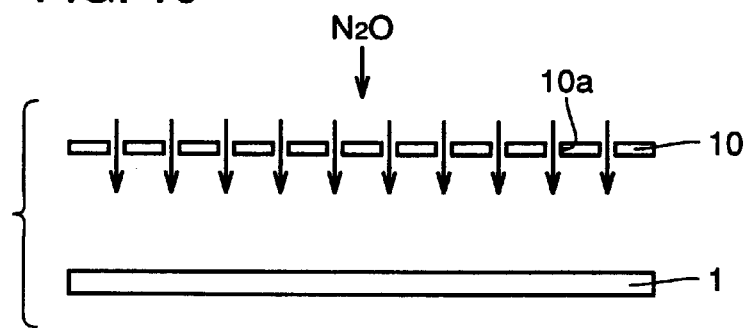
FIGS. 10 and 11 are cross sectional views of semiconductor devices showing first and second examples of a method of manufacturing a silicon oxynitride film according to a fourth embodiment.

FIG. 10 is a view for describing a method of forming a silicon oxynitride film according to a fourth embodiment. In this embodiment, the RTA device is also used to cause $N_2O$ and silicon substrate 1 to react with each other without heating, that is, pyrolyzing $N_2O$. In this embodiment, $N_2O$ gas is blown to silicon substrate 1 from above with a plate 10 having an opening 10a placed therebetween in order to blow $N_2O$ gas, like a shower, to the surface of silicon substrate 1. The distance between silicon substrate 1 and plate 10 is preferably several centimeters. When such plate 10 is used, $N_2O$ gas that is not heated, that is, not pyrolyzed can be blown to the surface of silicon substrate 1 and caused to react with the entire surface of silicon substrate 1. As a result, a silicon oxynitride film having nitrogen localized only at an $SiO_2$—Si interface can be formed.

Figure 11:
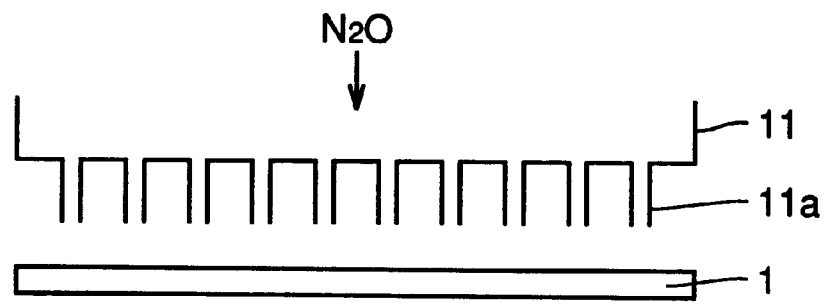

$N_2O$ gas may be blown to the surface of silicon substrate 1 by using an injector 11 having a plurality of nozzles 11a, as shown in FIG. 11, instead of using plate 10. The distance between the end of nozzle 11a and silicon substrate 1 is preferably several centimeters. Even when such an injector 11 is used, $N_2O$ gas that is not heated, that is, not pyrolyzed can be blown to the surface of silicon substrate 1 and caused to react with the entire silicon substrate surface. Therefore, a silicon oxynitride film having nitrogen localized only at an $SiO_2$—Si interface is formed.

Fifth Embodiment

Figure 12:
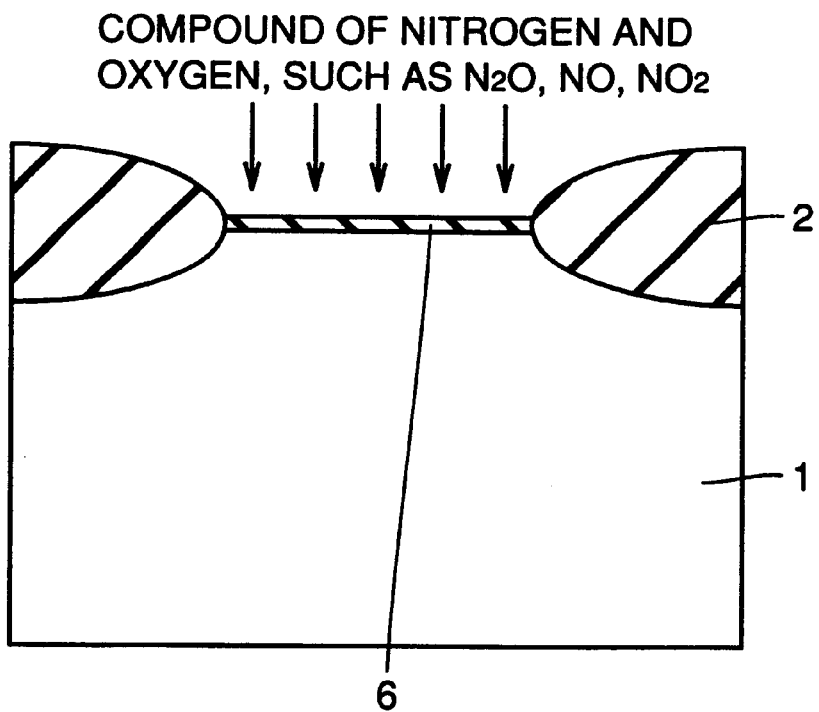
FIG. 12 is a cross sectional view of a semiconductor device showing a method of manufacturing a silicon oxynitride film according to a fifth embodiment.

FIG. 12 is a cross sectional view of a semiconductor device for describing a method of forming a silicon oxynitride film according to a fifth embodiment.

First, a silicon oxide film 6 is formed on the surface of silicon substrate 1. An compound of nitrogen and oxygen such as $N_2O$, NO and $NO_2$ is ion-implanted into an interface between silicon substrate 1 and silicon oxynitride film 6. Thus, a silicon oxynitride film having nitrogen localized only at an $SiO_2$—Si interface is formed. Since the compound to be implanted includes oxygen according to this method, oxygen holes (silicon dangling bonds such as an Si—Si bond) that exist at the interface portion between silicon substrate 1 and silicon oxide film 6 decrease, and a silicon oxynitride film having TDDB characteristics higher than the silicon oxynitride films obtained in the first to fourth embodiments is obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:

a silicon substrate;

a silicon oxynitride film provided on said silicon substrate and not including a chemical bond unit shown by the structural formula below at any portion in its film thickness direction

said silicon oxynitride film being made of:
a $SiO_2$ layer; and
a silicon oxynitride layer provided at an interface between said $SiO_2$ layer and said silicon substrate.

2. The semiconductor device according to claim 1, wherein said silicon oxynitride film is formed by bringing gas including non-pyrolyzed $N_2O$ into contact with a surface of the silicon substrate while heating said silicon substrate.

3. The semiconductor device according to clam 1, wherein said silicon oxynitride layer includes $Si_3N$ and $Si_2NO$ chemical bond unit.

4. A semiconductor device, comprising:

a silicon substrate having a main surface; and a silicon oxynitride film provided on the main surface of said silicon substrate;

wherein nitrogen atoms in said silicon oxynitride film are localized near the main surface of said silicon substrate, so that $Si_3N$ and $Si_2NO$ chemical bond units are formed.

* * * * *